United States Patent
Marmonier

(10) Patent No.: US 10,291,003 B2
(45) Date of Patent: May 14, 2019

(54) TRUNKING INTENDED TO CARRY MODULES CONNECTED TO POWER CABLES AND TO COMMUNICATION CABLES

(71) Applicant: Schneider Electric Industries SAS, Rueil-Malmaison (FR)

(72) Inventor: Jean Marmonier, Saint Aunes (FR)

(73) Assignee: SCHNEIDER ELECTRIC INDUSTRIES SAS, Rueil-Malmaison (FR)

( * ) Notice: Subject to any disclaimer, the term of this patent is extended or adjusted under 35 U.S.C. 154(b) by 0 days.

(21) Appl. No.: 15/373,047

(22) Filed: Dec. 8, 2016

(65) Prior Publication Data
US 2017/0179695 A1 Jun. 22, 2017

(30) Foreign Application Priority Data
Dec. 16, 2015 (FR) .................................. 15 62507

(51) Int. Cl.
*H02G 3/04* (2006.01)
*H02G 3/08* (2006.01)
(Continued)

(52) U.S. Cl.
CPC .............. *H02G 3/04* (2013.01); *H02B 1/202* (2013.01); *H02G 3/083* (2013.01); *H05K 5/0226* (2013.01); *H05K 7/183* (2013.01)

(58) Field of Classification Search
CPC ........... H02G 3/04; H02G 3/083; H05K 7/183
See application file for complete search history.

(56) References Cited

U.S. PATENT DOCUMENTS 5,024,614 A * 6/1991 Dola .................... H02G 3/0431
174/486
5,998,732 A * 12/1999 Caveney ................ H02G 3/105
174/481
(Continued)

FOREIGN PATENT DOCUMENTS

FR 2 819 114 7/2002

OTHER PUBLICATIONS

French Preliminary Search Report dated May 31, 2016 in French Application 15 62507 filed on Dec. 16, 2015 (with English Translation of Categories of Cited Documents).
(Continued)

*Primary Examiner* — William H. Mayo, III
*Assistant Examiner* — Hiram E Gonzalez
(74) *Attorney, Agent, or Firm* — Oblon, McClelland, Maier & Neustadt, L.L.P.

(57) ABSTRACT

A raceway for a low voltage cabinet, including a body, a bottom and an intermediate wall jointly delimiting a compartment with a permanent opening extending along one side of the raceway, and a flap hinged on the body towards the raceway on the side of the raceway in which the permanent opening is delimited, this flap being mobile so that it can be folded to face the intermediate wall or to be separated from it. The compartment is designed to hold communication cables, the intermediate wall is designed to hold power cables on its face opposite the compartment, the flap is thus designed to support modules on its face opposite the intermediate wall, each module being connected to at least one communication cable and at least one power cable.

7 Claims, 3 Drawing Sheets

(51) Int. Cl.
*H05K 5/02* (2006.01)
*H05K 7/18* (2006.01)
*H02B 1/20* (2006.01)

(56) References Cited

U.S. PATENT DOCUMENTS

| | | | |
|---|---|---|---|
| 6,084,180 A * | 7/2000 | DeBartolo, Jr. | H02G 3/0418 174/101 |
| 6,797,885 B2 * | 9/2004 | Magyar | H02G 3/0487 174/481 |
| 7,390,977 B2 * | 6/2008 | Hill | H02G 3/128 174/480 |
| 7,589,286 B2 * | 9/2009 | VanderVelde | H02G 3/0418 174/480 |
| 8,183,471 B2 * | 5/2012 | Handler | H02G 3/0418 174/480 |
| 2002/0160660 A1 | 10/2002 | Mendoza | |
| 2009/0200057 A1 | 8/2009 | Caveney et al. | |

OTHER PUBLICATIONS

U.S. Appl. No. 15/261,098, filed Sep. 9, 2016, Jean Marmonier et al.
U.S. Appl. No. 14/837,396, filed Aug. 27, 2015, Jean Marmonier.

* cited by examiner

TRUNKING INTENDED TO CARRY MODULES CONNECTED TO POWER CABLES AND TO COMMUNICATION CABLES

TECHNICAL DOMAIN

The invention relates to a low voltage cabinet containing electrical input/output modules supported on a standard DIN type rail. Such modules are used to connect sensors and actuators present on an installation, with inputs and outputs from a programmable logic controller and/or a protection relay and/or a remote terminal unit.

STATE OF PRIOR ART

This type of cabinet can be used particularly in systems for the protection of medium and high voltage electrical networks, that have to permanently measure electrical data such as current and voltage measurements, output by current and voltage transformers installed on conductors in these electrical networks.

One such known low voltage cabinet 1 shown in a sectional top view on FIG. 1, includes a compartment containing a plane back 2 extended by two sides 3, 4, with a door 6. The equipment in this cabinet is supported on its back 2 and is symmetrically distributed about a vertical plane S that separates the back into two halves.

The right half of this cabinet includes a cableway 7 extending vertically in the central part of the back, a raceway 8 running along the side 4, and modules 9 arranged vertically in line with each other between the cableway 8 and the raceway 8. The left half of the back 2 has the same elements arranged symmetrically about the plane S.

The modules 9 are thus connected firstly to the sensors and actuators of the system through their connection to the cables in the cableway 7, and secondly to a programmable logic controller through their connection to the electrical conductors supported in the raceway 8.

In this arrangement, the number of modules that can be installed is limited mainly by the height of the cabinet, that correspondingly limits the number of inputs and outputs.

The purpose of this invention is to disclose a solution to increase the number of inputs and outputs in a small cabinet.

PRESENTATION OF THE INVENTION

To achieve this, the purpose of the invention is a raceway for a low voltage cabinet including a body comprising a bottom and an intermediate wall jointly delimiting a compartment with a permanent opening extending along one side of the raceway, and a flap hinged on the body at the side of the raceway in which the permanent opening is delimited, this flap being mobile so that it can be folded to face the intermediate wall or to be separated from it, the compartment being designed to hold communication cables, the intermediate wall being designed to hold power cables on its face opposite the compartment, the flap thus being designed to support modules on its face opposite the intermediate wall, each module being connected to at least one communication cable and at least one power cable.

With this arrangement, the communication cables, the power cables and the modules connected to these cables are superposed on each other, which is very compact, but at the same time the operator can easily access these different components. The number of modules and consequently the number of inputs and outputs can thus be increased for a given size of cabinet compartment.

The invention also relates to a raceway thus defined in which the body is composed of a folded metal plate to form the bottom and the intermediate wall.

The invention also relates to a raceway thus defined in which the body comprises a side delimiting the compartment jointly with the bottom and the intermediate wall, this side being a continuation of the bottom of the side opposite the intermediate wall, this side making a right angle with the bottom, the orientation of the intermediate wall being oblique relative to the bottom.

The invention also relates to a raceway thus defined, in which the intermediate wall comprises holes that will contain power cable attachment collars.

The invention also relates to a raceway thus defined, in which the flap is formed by a plate hinged on the body and is supported by the body, being engaged on this body.

The invention also relates to a raceway thus defined, including a return extending along the extension to the intermediate wall, being folded relative to this intermediate wall, this return comprising openings or windows into which corresponding tabs will fit projecting from one edge of the flap, to engage the flap on the body and its hinge.

The invention also relates to a cabinet, comprising at least one raceway thus defined.

DETAILED PRESENTATION OF PARTICULAR EMBODIMENTS

The basic concept of the invention is to provide a single raceway containing superposed communication cables and power cables and modules connected to these cables with good compactness. Due to this compact and self-contained structure, several raceways can be placed in a modular manner in the same cabinet, so that the number of modules installed in a given size of cabinet can be increased.

Figures 2, 3:
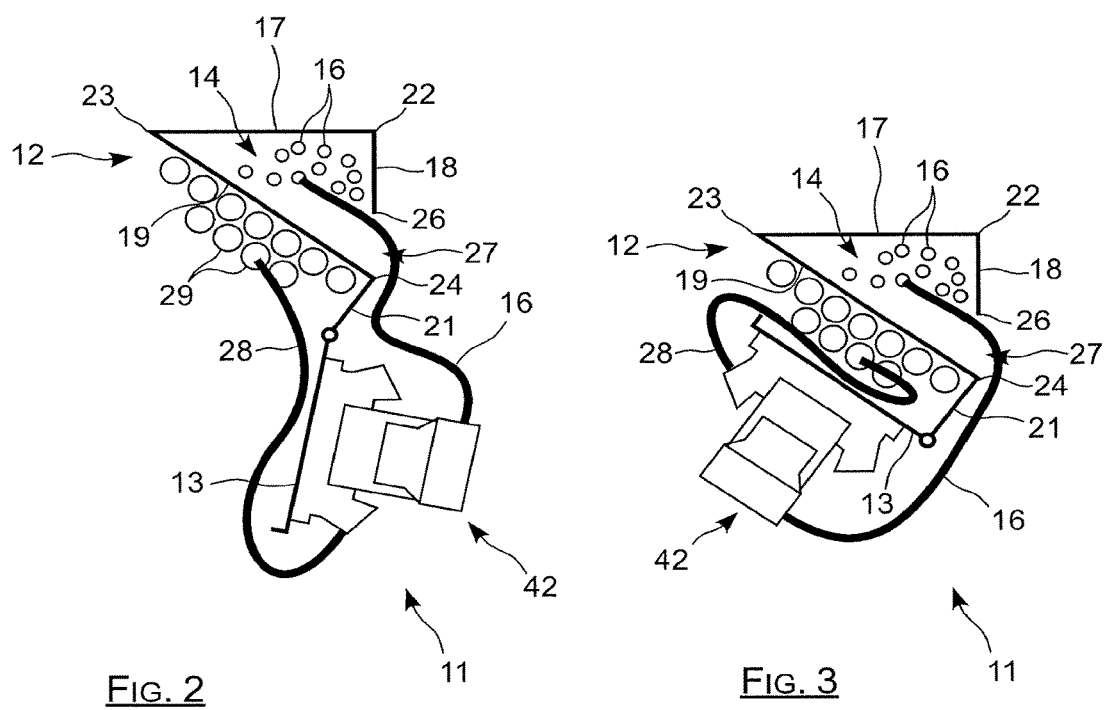
FIG. 2 is a sectional view of a raceway according to the invention when it is open.
FIG. 3 is a sectional view of a raceway according to the invention when it is closed.

The raceway according to the invention shown on FIG. 2 and identified with mark 11 comprises a body 12 made of folded plate with a generally plane metal plate flap 13 hinged onto this body 12. This raceway 11 extends generally in the longitudinal direction and is designed to be installed vertically in a low voltage cabinet, and several raceways according to the invention can be installed side by side in such a cabinet.

The body 2 of this raceway 11 is a metal plate comprising several parallel longitudinal folds delimiting a partially closed compartment 14 inside which a set of data communication cables 16 is housed.

This body 12 comprises a bottom 17 located between a side folded at a right angle from this bottom, and an intermediate wall 19 at an oblique angle from the bottom 17, this intermediate wall being prolonged by a return 21. The compartment 14 thus has a generally triangular section delimited by the bottom 17, the side 18 and the intermediate wall 19.

The bottom 17 this extends between a first fold 22 and a second fold 23, that separate the bottom 17 from the side 18, and the bottom 17 from the intermediate wall 19 respectively.

The intermediate wall 19 is inclined at about thirty or forty degrees from the bottom around the fold 23, so that it is facing this bottom 17. It has a free edge, corresponding to a third fold 24 delimiting the return 21 that is positioned facing the side 18 and at a distance from the free edge 26 of this side 18, so as to form a permanent longitudinal opening 27 in the compartment 14.

The data communication cables 16 can thus be freely engaged inside the compartment 14 of the raceway by being slid into the permanent opening 27 that extends along the entire length of this raceway between its side 18 and the intermediate wall 19.

As can be seen on FIGS. 2 and 3, the intermediate wall 19 supports a series of power cables 28 located in conduits 29 fixed to its outside face, in other words its face opposite the compartment 14 that it delimits.

This intermediate metal plate wall 19 is advantageously perforated by a series of holes 31 inside which attachment collars 32 fixing conduits 29 containing the power cables 28 are routed. For example, these collars 32 are made of plastic, as shown diagrammatically on FIGS. 4 and 5.

Advantageously, the plate used to make the raceway is zinc-plated, so that an electromagnetic protection cage can be made to protect communication cables from the power cables.

The free edge of the intermediate wall 19 is folded to a right angle at the fold 24, to form the return 21 that itself comprises two other folds 33 and 34 parallel to the longitudinal direction of the raceway. The cross-section of this return is in the form of a letter U connected by one of its legs to the intermediate portion through the fold 24.

The free portion of this return 21 is identified by the mark 36 and extends over the entire length of the raceway at a distance from the intermediate wall 19 approximately equal to the global thickness of the conduits 29 supported on this intermediate wall 19.

Figure 4:
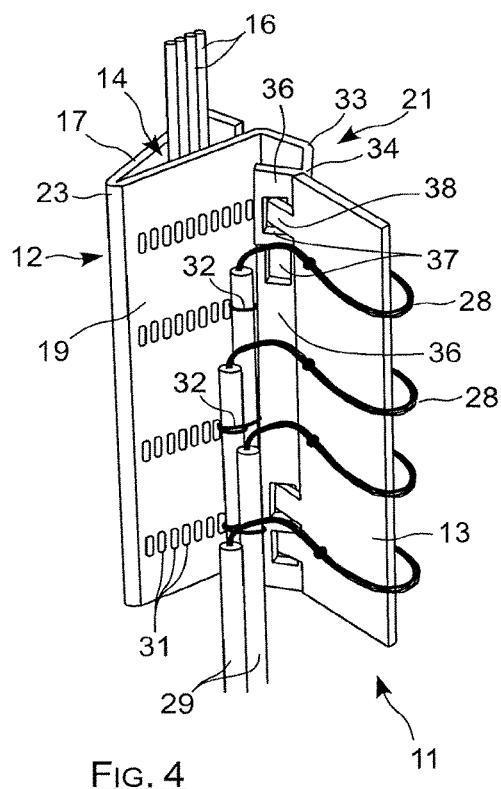
FIG. 4 is a perspective view of a raceway according to the invention when it is open.

This free portion 36 comprises a series of openings or windows 37 at regular intervals, with a generally rectangular shape. These windows 37 will hold corresponding tabs 38 that project from an edge of the flap 13 so as to support this flap 13 so that it is hinged onto the body 12. This flap 13 is thus free to move between a position separated from the intermediate wall 19 as shown in FIGS. 2 and 4, and a position folded towards the intermediate wall 19 in contact with the conduits 29, as shown in FIGS. 3 to 5 in which it extends parallel to this intermediate wall.

Figure 6:
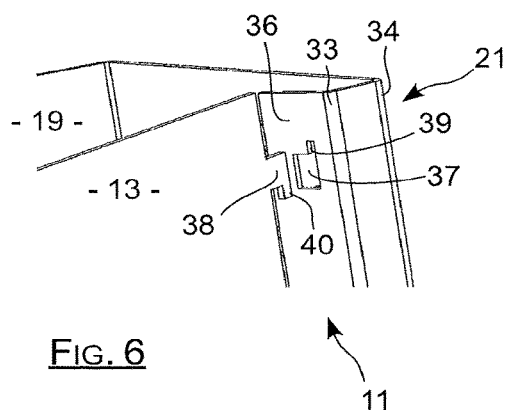
FIG. 6 is a sectional view showing how the flap is engaged with the body of a raceway according to the invention.

As can be seen in more detail on FIG. 6, the windows 37 can advantageously have a rectangular contour with a lateral edge prolonged upwards by a notch 39 into which a tab 38 can be engaged, and the tabs 39 can comprise an additional retaining stud 40 extending downwards parallel to their free edge. Under these conditions, engagement of a tab 38 consists of positioning it facing the edge of the window 37 extended by a notch 39, and pushing it into this window so that it is blocked in the window, being retained in it by the stud 40.

A DIN type standard rail mark 41 is fitted on the outside face of flap 13, namely on its face opposite the intermediate wall when it is folded towards the wall, with modules 42 fixes above each other to this rail extending parallel to the longitudinal direction of the raceway 11. Each module 42 is connected to at least one communication cable 16 and to at least one power cable 28.

Figure 5:
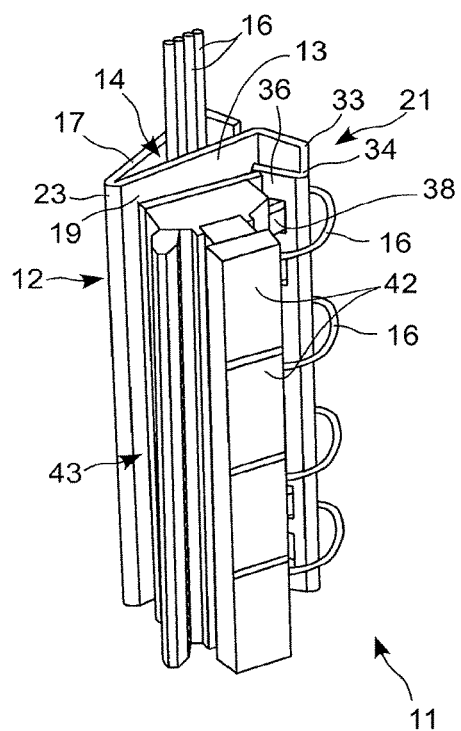
FIG. 5 is a perspective view of a raceway according to the invention when it is closed.

More particularly, and as can be seen on FIGS. 3 and 5, each module 42 is connected to a communication cable 16, one end of which comes out of the compartment 14 through the permanent opening 27. Similarly, each module is connected to a power cable 28 supported on the intermediate wall 19 and the end of which comes out of the region located between the intermediate wall 19 and the flap 13, passing through another permanent opening 43 delimited by the free edge of the flap 13 of the intermediate wall 19.

Figure 7:
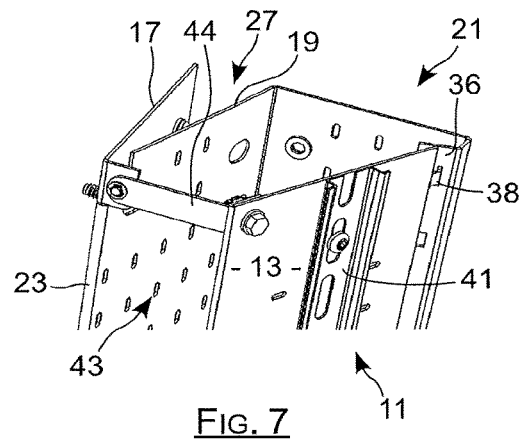
FIG. 7 is a perspective view of the structure of a raceway according to the invention.

As can be seen on FIG. 7, the raceway 11 is advantageously provided with tabs or spaces 44 fitted on the intermediate wall close to the fold 23. Each spacer 44 extends perpendicularly to the intermediate wall and has a free end to which the flap 13 is fixed by a bolt close to its free edge. This attachment or immobilisation of the flap 13 is made after all the modules 42 that it supports have been connected to the power cables 28.

Figure 1:
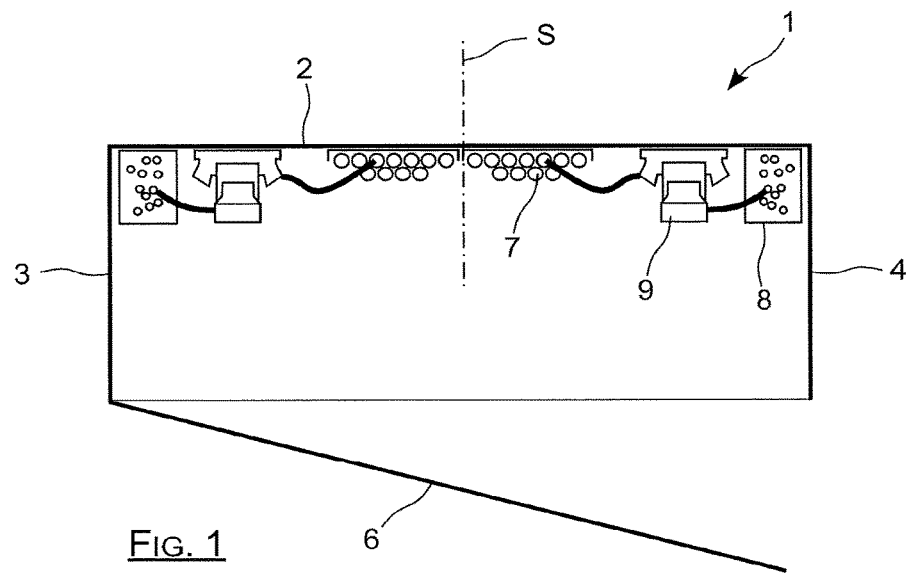
FIG. 1, already described, is a sectional view of a low voltage cabinet known in Prior art.

In general, the raceway according to the invention makes it possible to double the number of modules and connections that can be installed in a given size of cabinet compartment, for example like that according to the art shown in FIG. 1.

Figure 8:
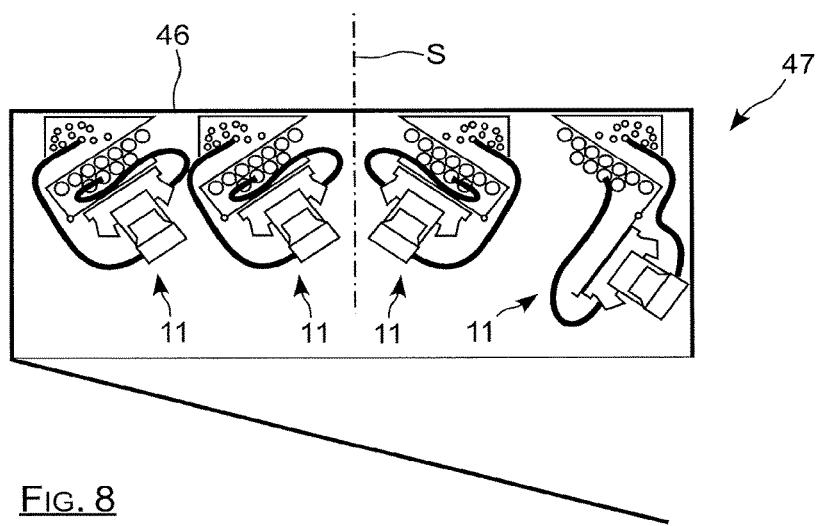
FIG. 8 is a sectional view of a first embodiment of a low voltage cabinet according to the invention.

More specifically, and as shown on FIG. 8, four raceways according to the invention can be fixed to the bottom 46 of a cabinet compartment 47 with the same dimensions as that in FIG. 1. As shown in FIG. 8, each raceway 11 is fixed at its bottom to the back 46 of the compartment 47, such that the flaps 13 of these raceways with the modules 42 fixed to them are facing the front of this cabinet compartment.

Furthermore, the bottoms of the two raceways 11 installed in the right part of the cabinet compartment relative to its plane of symmetry S, are fixed to the back 46 of this compartment. The modules supported by these raceways are also oriented to face the central part of the front face of the cabinet, allowing for the fact that the intermediate walls of the raceways that support them are oblique relative to the bottoms of these raceways.

The installation is symmetric for the two raceways 11 installed in the left part of the compartment; each raceway in the left part is installed upside down relative to the raceways in the right part so as to invert the orientation of the modules contained in them. In other words, since the raceways can be inverted along the vertical direction, the modules supported by the left raceways and the modules supported by the right raceways converge towards the central region of the front face of the cabinet compartment.

Figure 9:
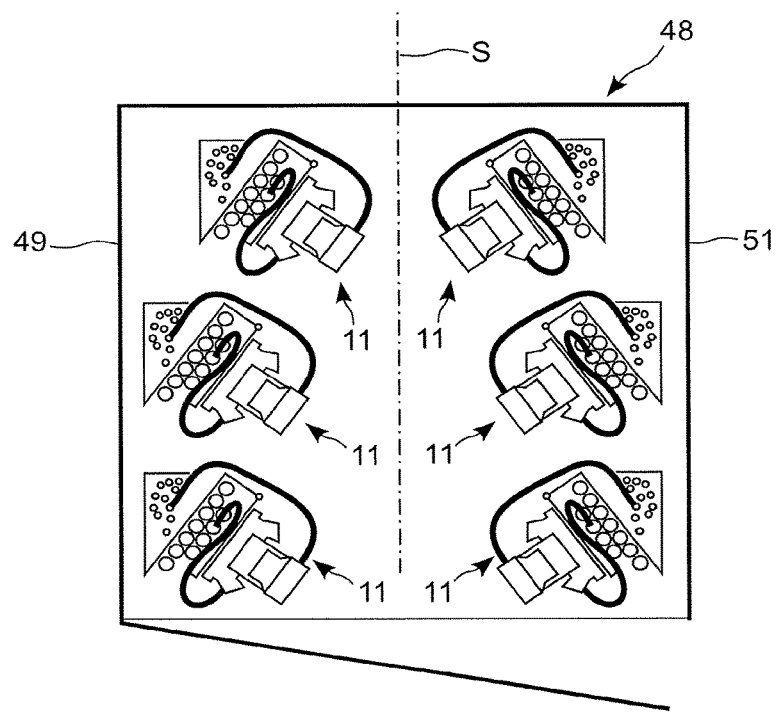
FIG. 9 is a sectional view of a second embodiment of a low voltage cabinet according to the invention.

In the case of a double-depth cabinet compartment such as the cabinet compartment 48 shown on FIG. 9, three raceways can be fixed to each of the sides 49, 51 of this compartment. Considering the fact that the intermediate wall of each raceway 11 is oblique relative to its bottom 17, and therefore the modules 42 supported by the flap 13 parallel to the intermediate wall 13 are also oblique, the raceways can be arranged such that the different modules are facing the front central portion of the compartment.

Under these conditions, despite the relatively high compactness of equipment installed in the cabinet 48, the different flaps can all be opened so that an operator can install and connect power cables to the different modules in each of the six raceways.

In the same way as in the example in FIG. 8, in the arrangement in FIG. 9, the raceways installed in the left part of the compartment are upside down from those installed in the right part, such that all the modules converge and face the central portion of the front face of the cabinet. This facilitates access to the different modules.

Moreover, the fact that the communication cables 17 are placed in the compartment 14 means that the raceway can be fitted in the factory with modules 42 and communication cables 16 connected to these modules. All that remains to be done on site is then to install the pre-equipped raceway and to fix the power cables and connect them to the modules that it supports. This is further facilitated by the fact that the power cables 28 and the modules 42 are located on the front part of the raceway, in other words on the side opposite the bottom of the raceway. Another possibility consists of also installing the pre-equipped raceways in the cabinet so that the cabinet can be directly connected on site.

In practice, during installation on site, the flaps 13 supporting the modules 42 in a particular cabinet will be opened in turn to provide access to the intermediate wall so that power cables 28 can be fixed in them, to connect them to the modules 42 before closing the flap on which they are supported and fixing it with the tabs or spacers 44.

Another advantage of the invention is that it makes it possible to bring the modules 42 closer to the front face of the low voltage cabinet thus equipped, which makes it easier to read information displayed on display units or screens fitted in these modules.

The invention claimed is:

1. A raceway for a low voltage cabinet, comprising:
a body comprising a bottom and an intermediate wall jointly delimiting a compartment with a permanent opening extending along one side of the raceway, the intermediate wall including opposite outer and inner faces, the inner face delimiting the compartment, the outer face being opposite to the compartment; and
a flap hinged on the body at the side of the raceway in which the permanent opening is delimited, said flap being mobile so that said flap is configured to be folded to face the outer face of the intermediate wall and to be separated from said intermediate wall, the compartment being configured to hold communication cables, the intermediate wall being configured to hold power cables on its outer face opposite the compartment, the flap being configured to support modules fixed on its face opposite the intermediate wall, each module being connected to at least one of the communication cables and at least one of the power cables.

2. The raceway according to claim 1, in which the body is composed of a folded metal plate to form the bottom and the intermediate wall.

3. The raceway according to claim 2, in which the body comprises a side delimiting the compartment jointly with the bottom and the intermediate wall, said side being a continuation of the bottom of the side opposite the intermediate wall, said side making a right angle with the bottom, the orientation of the intermediate wall being oblique relative to the bottom.

4. The raceway according to claim 2, in which the intermediate wall comprises holes that will contain attachment collars for the power cables.

5. The raceway according to claim 2, in which the flap is formed by a plate hinged on the body and is supported by the body, being engaged on said body.

6. The raceway according to claim 5, including a return extending along an extension to the intermediate wall, being folded relative to said intermediate wall, said return comprising openings or windows into which corresponding tabs will fit projecting from one edge of the flap, to engage the flap on the body and its hinge.

7. A low voltage cabinet according to claim 1.

\* \* \* \* \*